United States Patent
Jones et al.

(10) Patent No.: US 7,804,349 B2
(45) Date of Patent: Sep. 28, 2010

(54) TIMING SIGNAL GENERATOR PROVIDING SYNCHRONIZED TIMING SIGNALS AT NON-INTEGER CLOCK MULTIPLES ADJUSTABLE BY MORE THAN ONE PERIOD

(75) Inventors: Christopher C. Jones, Winchester, MA (US); Michael F. McGoldrick, North Reading, MA (US)

(73) Assignee: Teradyne Inc., North Reading, MA (US)

( * ) Notice: Subject to any disclaimer, the term of this patent is extended or adjusted under 35 U.S.C. 154(b) by 76 days.

(21) Appl. No.: 12/337,999

(22) Filed: Dec. 18, 2008

(65) Prior Publication Data

US 2009/0167401 A1    Jul. 2, 2009

Related U.S. Application Data

(60) Provisional application No. 61/018,443, filed on Dec. 31, 2007.

(51) Int. Cl.
*H03K 3/00* (2006.01)

(52) U.S. Cl. .................. 327/299; 327/131; 327/296; 713/400

(58) Field of Classification Search ............ 327/131, 327/135–136, 291, 293, 296, 298–299; 713/100–401, 713/502
See application file for complete search history.

(56) References Cited

U.S. PATENT DOCUMENTS

| | | | |
|---|---|---|---|
| 4,231,104 A | | 10/1980 | St. Clair |
| 5,274,796 A | * | 12/1993 | Conner .................. 713/400 |
| 5,689,515 A | | 11/1997 | Panis |
| 5,905,967 A | | 5/1999 | Botham |

* cited by examiner

*Primary Examiner*—An T Luu
(74) *Attorney, Agent, or Firm*—BainwoodHuang

(57) ABSTRACT

A system for providing a plurality of synchronous timing signals having period values that are not even multiples of the clock period including a plurality of local edge generators receiving the clock signals, each local generator including local programmable means to record an absolute time at which to generate a timing signal in the current or future period and the means to generate that timing signal at a synchronous even sub-division of the clock period resolution. A separate time value is maintained allowing generated timing signals to be delayed by more than one period. An output delay circuit generates the timing signal responsive to a future time value and a phase offset. The phase offset can be provided using a clock multiplier and serial parallel converter to simplify hardware realizations.

20 Claims, 5 Drawing Sheets

TIMING SIGNAL GENERATOR PROVIDING SYNCHRONIZED TIMING SIGNALS AT NON-INTEGER CLOCK MULTIPLES ADJUSTABLE BY MORE THAN ONE PERIOD

FIELD OF THE INVENTION

The invention related generally to the field of timing signal generation, and more particularly to programmable, synchronized timing signal generation.

BACKGROUND OF THE INVENTION

Timing signal generators are used in large electronic systems to accurately coordinate activities across a system at programmed instants of time. These systems are typically controlled synchronously by a system clock derived from a common timing source, such as a crystal oscillator. A timing generator will generate the timing signals by counting predetermined numbers of system clock cycles. In order to provide finer timing resolution than available with a system clock cycle, it is necessary to have some method to generate finer timing delays. Several approaches have been proposed for generating timing signals that have finer resolution than a system clock.

U.S. Pat. No. 4,231,104 to St. Clair describes a means of generating a timing period that is not even multiples of the system clock. St. Clair first proposes a scheme by which a first electronic circuit, referred to as a period oscillator, digitally tracks a phase relationship between a desired timing and a system clock by continually adding a number representing a digital fraction of the system clock. The fraction, or "residue" value as it is referred to by St. Clair, is then fed into a circuit that adjusts the timing signals by a delay value suitable to result in the desired timing. The St. Clair patent also describes a second electronic circuit, referred to as a local edge generator, that when combined with the period oscillator is capable of generating pulses of particular widths.

U.S. Pat. No. 5,274,796 to Conner extends the above approach by passing period timing and a residue count, determined by the first electronic circuit to the local edge generators. The Conner patent provides a means of digitally tracking the relationship between the system clock and desired timing signals and passing this information at the system clock rate such that a fine timing adjustment can be made directly at the output where used. This, as the Conner patent points out, offers advantages in that "the timing system would be synchronous (promoting simplicity of manufacture and reliable operation); transmission line inaccuracies would not contribute to timing inaccuracies; there would be reduced cross-talk (owing to the need to distribute only one crystal phase), and there would be a small number of gates (which tend to distort signals) between the clock signal and the fine timing signal, yielding improved accuracy."

SUMMARY OF THE INVENTION

This invention describes enhancements to the timing generator described in the Conner patent. This invention expands on the inventions described in the Conner patent to allow for timing of signal edges to occur across multiple time periods and provides a synchronous means of providing a finer timing signal edge placement on out going signals or higher resolution sampling of incoming signals.

One embodiment of the invention relates to a system for providing timing signals including a master period generator. The master period generator includes a first resettable counter resettable by a period signal for counting clock cycles within a period of the periodic signal. The master period generator also includes a memory for storing a first period value and a second period value, and a match detector circuit providing a coincidence signal indicative of an output of the first resettable counter coinciding with the stored first period value. A signal conditioning circuit provides the period signal in response to the match detector circuit signal. The periodic signal has a non-integer relationship with respect to the clock cycles. The master period generator also includes a residue circuit determining a residue value according to the stored second period value and the period signal, and a second resettable counter resettable by a beginning-of-time signal. The second resettable counter maintains a time value indicative of clock cycles since the beginning-of-time signal.

Another embodiment of the invention relates to a process for providing timing signals. The process includes maintaining a first resettable count of clock cycles within a period of a periodic signal. The first resettable count of clock cycles is reset responsive to the periodic signal. A first period value and a second period value are stored and a match detector circuit signal is provided, indicative of the counted clock cycles coinciding with the stored first period value. The period signal is provided in response to the match detector circuit signal, having a non-integer relationship with respect to the clock cycles. A residue value is determined according to the stored second period value and the period signal, and a second resettable count is maintained of clock cycles measured from a beginning-of-time signal.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 1:
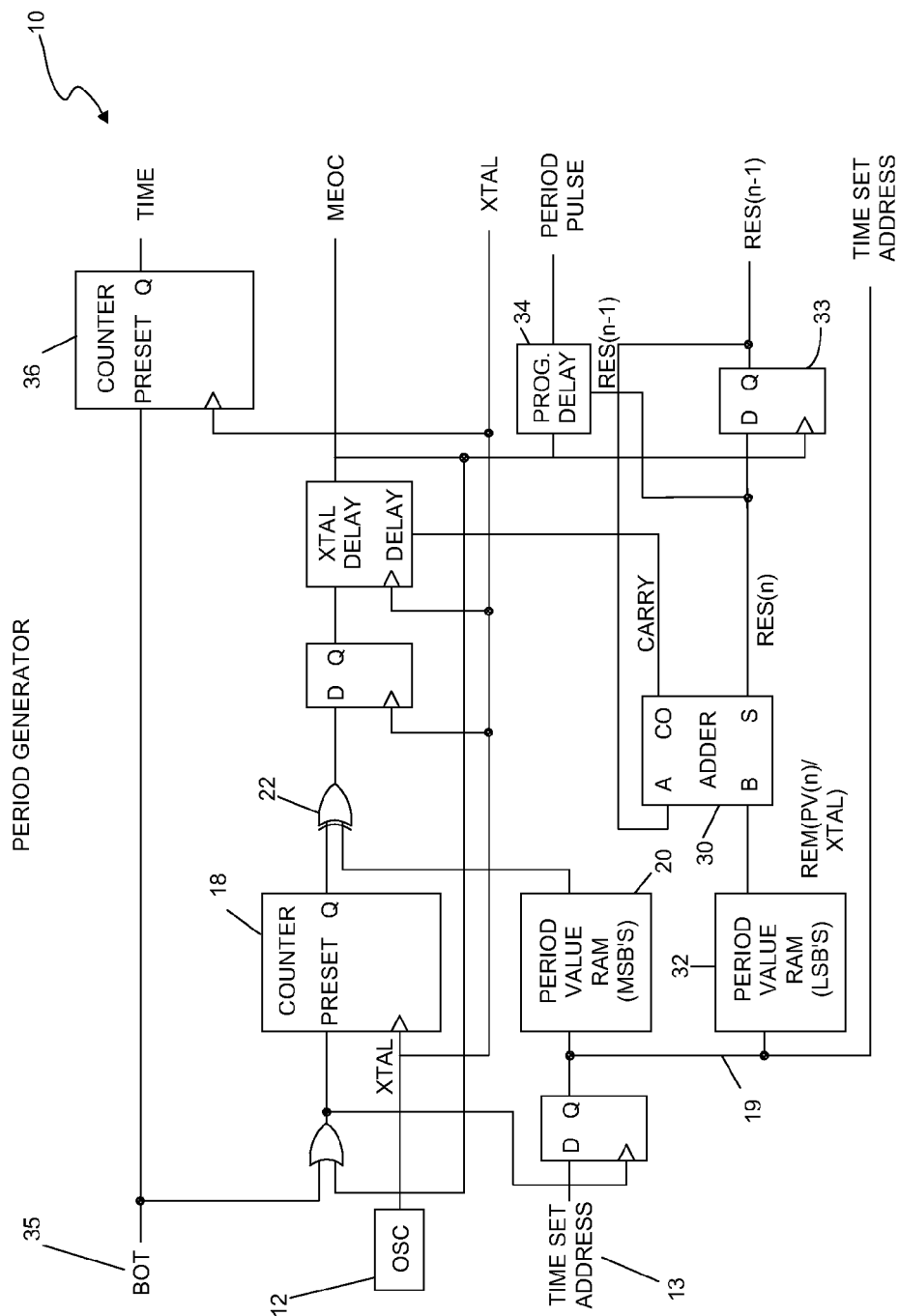
FIG. 1 is a schematic diagram of one embodiment of a period generator according to the invention.

Referring to FIG. 1, an exemplary embodiment of a period generator circuit 10 is shown for supplying the local timing generator circuit (FIG. 2) with a Master End Of Count (MEOC) 41 enable and residue bits 33 which respectively determine the start of a period and the phase relationship between that period and the system clock. This figure is similar to the circuit illustrated in FIG. 1 of the Conner patent, except that the exemplary embodiment uses different bit-widths and includes a master counter that counts XTAL 12 clocks from the beginning of a timing sequence. Likewise, the circuit is also similar to the circuit illustrated in FIG. 1 of the St. Clair patent, except that the "period generator" passes the period and residue information synchronously to the system clock instead of distributing the phase aligned timing signals.

Figure 2:
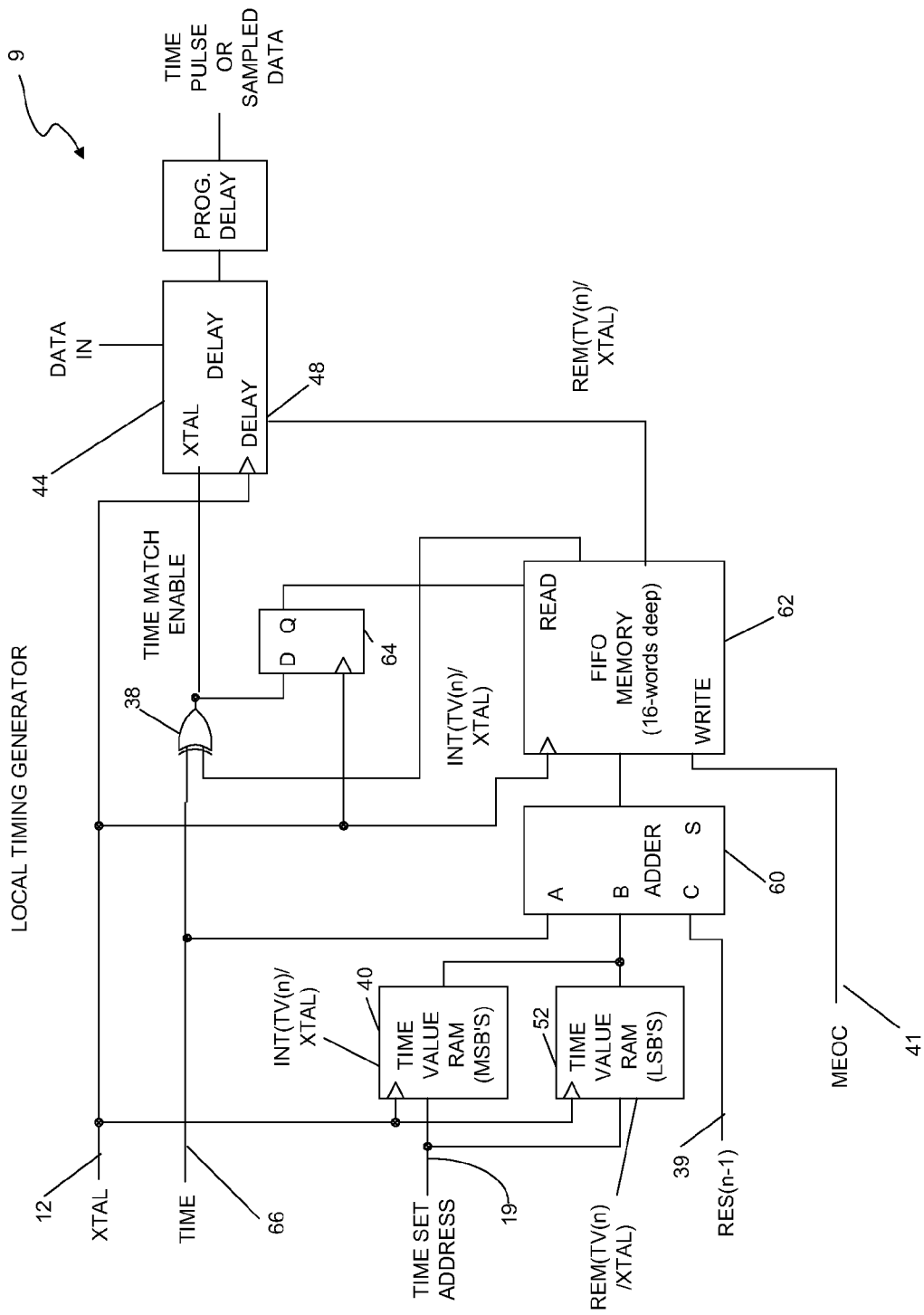
FIG. 2 is a schematic diagram of one embodiment of a local timing generator according to the invention.
Figure 3:
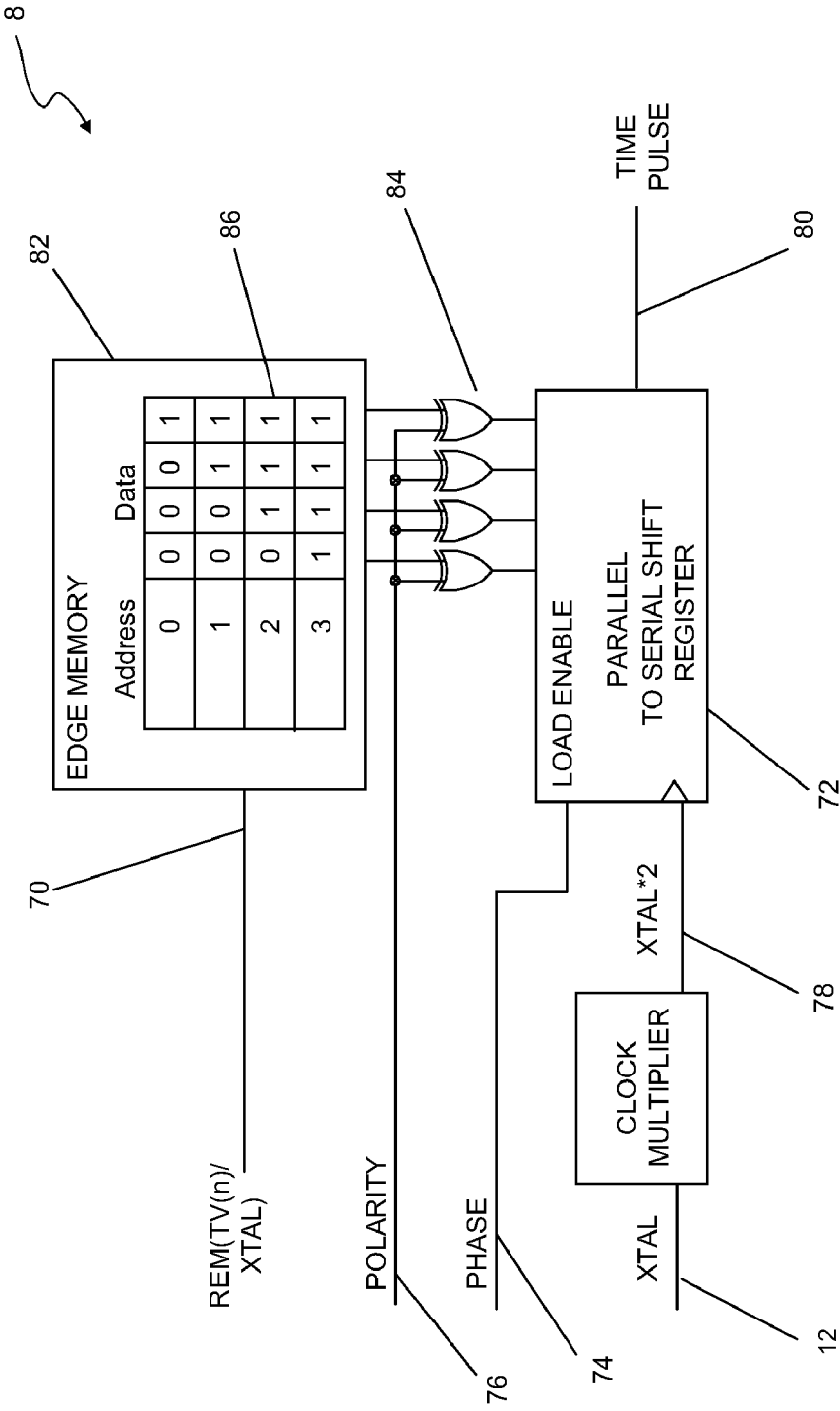
FIG. 3 is a schematic diagram of one embodiment of a converter for converting information into a pattern describing a timing edge according to the invention.
Figure 4:
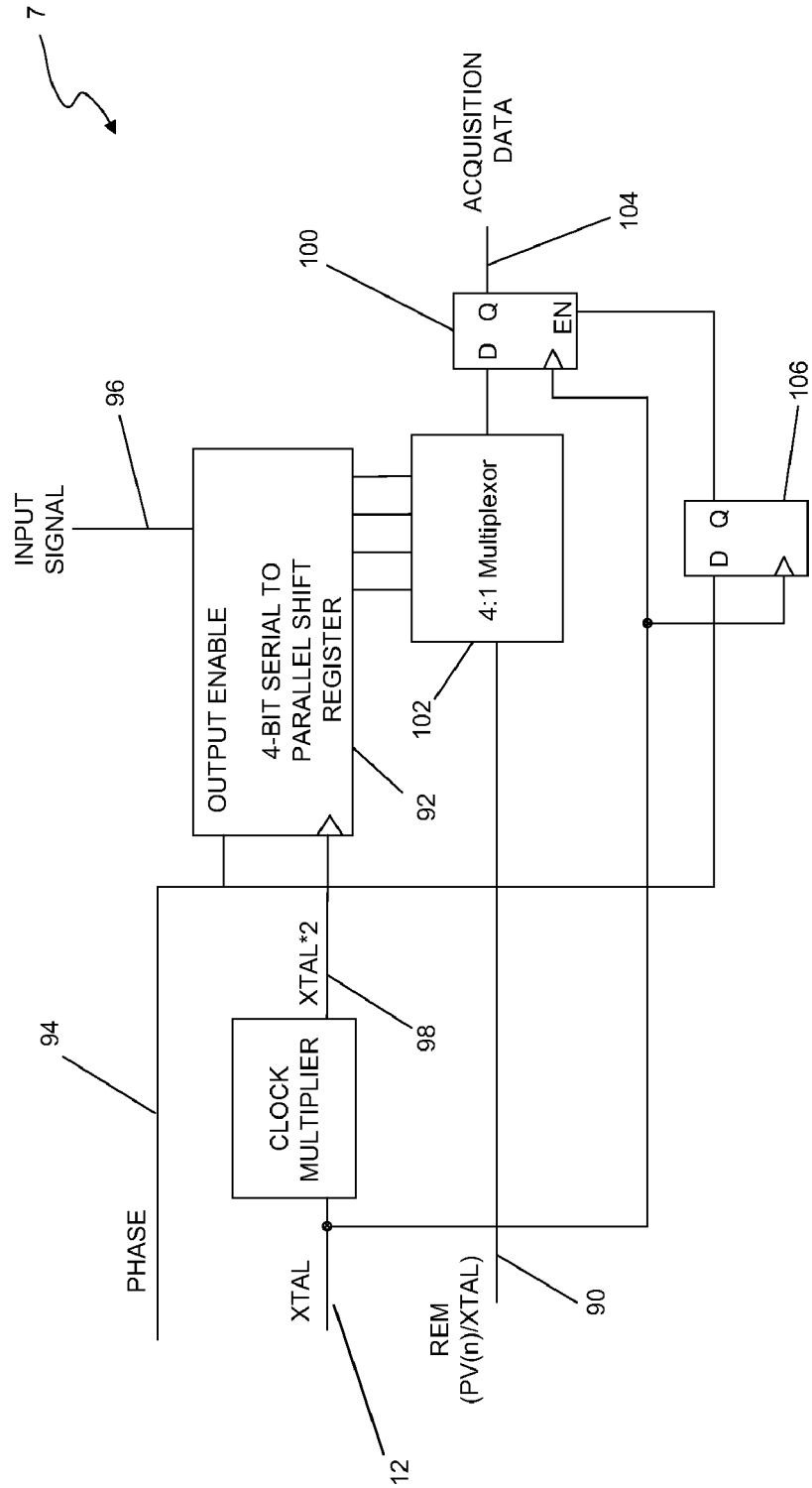
FIG. 4 is a schematic diagram of one embodiment of a circuit for locally sampling an incoming signal at the appropriate crystal clock period and phase time determined by incoming residue bits, according to the invention.

Referring to FIG. 2, an exemplary embodiment of a local timing generator circuit 9 is shown. This circuit is a modified form of the edge generator circuit illustrated in FIG. 2 of the Conner patent. The local timing generator circuit 9 together with the exemplary circuits illustrated in FIG. 3 and FIG. 4 provides the bulk of the material covered by this invention. The local timing generator 9 sums the current time and residue bits from the period generator with a time offset from a RAM (XTAL 12 count and residue) to generate a future time at which to generate a timing signal. This absolute time is stored in a FIFO memory and when that time occurs, whether in this period or some future period, the residue information is sent to a circuit described in FIG. 3 or FIG. 4 that provides the synchronous edge generation or signal sampling at the desired resolution.

FIG. 3 and FIG. 4 show examples of proposed specific implantations of the delay circuit shown in 44 of FIG. 2. Specifically, FIG. 3 diagrams a circuit that, given a XTAL 12 clock period enable pulse and residue information, converts that information into a pattern that describes a timing edge and sends this waveform out at a frequency that is some multiple of the system clock. While FIG. 4 diagrams a circuit that, given a XTAL 12 clock period enable pulse and residue information from the timing generator, samples incoming test signals at the appropriate phase relationship to the system clock which is at some multiple of the system clock.

Structure

Referring to FIG. 1, the exemplary embodiment of the period generator circuit 10 accepts as inputs an XTAL 12 synchronous clock source 12, an 8-bit time set address (TSET) 13, and a beginning of time signal BOT 35, that indicates the start of a timing sequence. The XTAL 12 clock source drives two counters: the period counter 18 and the current time counter 36. The TSET 13 address selects a period time value consisting of some number of XTAL 12 clocks in the most significant bit (MSB) PERIOD VALUE RAM 20 and a residue value (a fraction of a XTAL 12 clock period) in the least significant bit (LSB) PERIOD VALUE RAM 32. The output of the MSB PERIOD VALUE RAM is compared 22 with the period counter to determine the end of the period in terms of whole XTAL 12 clock periods. The output of the LSB PERIOD VALUE RAM is summed with adder 30 and the resulting carry indicates that the period MEOC 41 should be extended by one XTAL 12 clock period. The programmable delay 34 is used to generate a phase adjusted period pulse. The period pulse is used locally and not sent to the local timing generators.

Referring to FIG. 2, the local timing generator 9 accepts as inputs a count value indicating the number of XTAL 12 clocks since the start of a timing sequence (TIME) 66, a time set address (TSET) 19 to address the time value random access memories (TIME VALUE RAM's) 40 and 52, n residue bits (RES) 39 and the master end of count (MEOC) signal indicating the start of a new period. TSET VALUE RAM 40 holds the most significant bits of a time offset that corresponds to the integer number of XTAL 12 clocks while TSET VALUE RAM 52 holds the least significant bits of a time offset that corresponds to the partial fraction of a XTAL 12 system clock period. The current time count (TIME) 66 is added, via ADDER 60, together with the output of the TSET memories 40 and 52 and the residue bits. The resulting addition results in a time in the future which is loaded into the FIFO 62 at every MEOC 41 signal. The output of the FIFO when available two XTAL clock later is matched, via the match detector circuit 38, against the absolute time count 66. A resulting match will advance the FIFO 62 such that the next time that has been queued up will be available. The match detector circuit 38 also signals the output delay circuit 44 that a timing edge needs to occur. The residue bits are connected via 48 such that they signal the proper timing phase adjustment with relationship to the system clock for a timing pulse to be generated or data to be sampled.

Referring to FIG. 3, in general the circuit for generating the appropriate phase shift 8 on an outgoing edge receives the residue bits 70, a one XTAL 12 clock wide enable pulse indicating the XTAL 12 clock from which the fine timing edge should occur, PHASE pulse 74, a signal determining the polarity of the edge 76 and the system clock XTAL 12. The residue bits 70 address the edge memory 82, while the PHASE pulse 74 loads the high-speed parallel to serial shift register 72 with the appropriate data 86 describing the desired edge pattern. The data from the edge memory is inverted 84 based on the polarity input. The serial shift-register 72 accepts a clock which is equal to twice the frequency of XTAL 78 and shifts the parallel data out on either edge of the clock (commonly known as Double-Data Rate or DDR transfers).

More specifically, FIG. 3 describes a circuit 8 for locally generating either a positive going or negative going edge given the PHASE pulse 74, desired polarity 76, and the XTAL 12 system clock. The residue bits 70 are used to address the memory 82 that contains a bit patterns that describe the four possible edges that can be generated. In this exemplary implementation the edges are at: 0 ns, 2.5 ns, 5 ns, and 7.5 ns 86. Depending on the desired polarity of the edge, the output of the edge memory is inverted 84 before being loaded into a high-speed parallel to serial shift register 72. The bits representing the signal edge are shifted out at a clock rate that is a two times multiple of the frequency of XTAL system clock 78. Depending on the shift register technology, it can either shift out the edge pattern 80 on every positive clock edge at a frequency that is four times the system clock XTAL 12 multiple or shift out the pattern on both positive and negative edges of the clock with a clock rate double the frequency of XTAL 12 system clock, using a double-data rate (DDR) method available for higher transfer rate shift registers. This represents one embodiment of the invention. Other embodiments with higher frequencies that are higher multiples of the system clock rate, XTAL 12, are possible to provide even finer grained timing resolution.

FIG. 4 describes a circuit 7 for sampling at the appropriate time phase relative to the system clock XTAL 12. The circuit 7 receives the residue bits 90, the PHASE 94, and the system clock XTAL 12. The input signal 96 to be sampled on every rising and falling edge of the clock is fed into a high speed serial-to-parallel shift register 92 at a rate of two times the XTAL clock 98. The appropriate time phase is selected via the residue value 90 by the multiplexer 102 and clocked into output flip-flop 100 with the phase, delayed, via the delay circuit 106, by one XTAL 12 clock, used as the enable. This circuit 7 when used with the local timing generator 10 described in FIG. 2 can accurately sample an incoming signal at a 0 ns, 2.5 ns, 5 ns, or 7.5 ns offset from the XTAL 12 clock period. The acquisition data 104 is the input signal sampled at the correct phase.

The benefit of the circuits described in both FIG. 3 and FIG. 4 is that they are synchronous and that the place the high-speed logic directly at the outputs and inputs where they are used. This, as does the Conner patent, has the advantage that the high speed signals are not being passed around the system.

These circuits also take advantage of the trend towards using high-speed parallel to serial and serial to parallel circuits at the outputs of large scale electronic chips.

Operation

During operation, period generator 10, provides period pulses having programmed period values for cycle n, PV(n), that are other than integer multiples of the crystal period similar to the operation of the U.S. Pat. No. 5,274,796 to Conner and the U.S. Pat. No. 4,231,104 to St. Clair. The period generator, as does the Conner period generator, passes a registered version of the digital residue value 33, the master end of count pulse, MEOC 41, the timing set address 19 and the XTAL 12 clock directly to the local timing generators instead of passing the delayed signals themselves to the local timing generators as does St. Clair.

Figure 5:
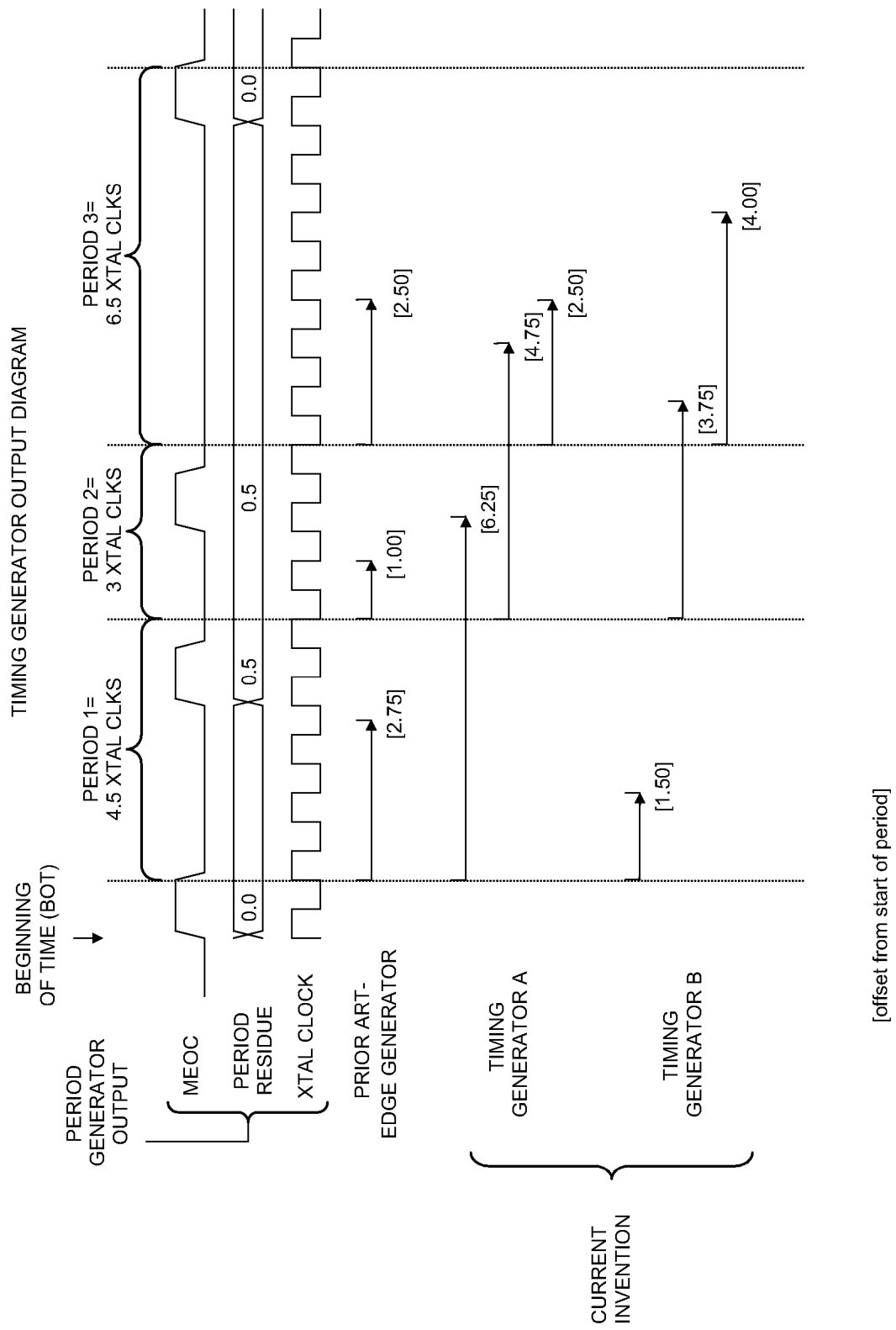
FIG. 5 is a timing diagram of a period generator, according to the invention.

The top of FIG. 5 shows an example of the output of the period generator for three sample periods having lengths of 4.5, 3, and 6.5 XTAL clocks. Period 1 counts 4 clocks before generating a MEOC pulse and a corresponding residue value of 0.5 or a binary 10 when a two-bit residue scheme is used. The residue value of 0.5 is used both to advance the actual period clock by ½ the XTAL clock period at the output (see FIG. 1 item 34), and it is also passed to the local timing generator to be added to the local phase offsets (XTAL clocks and residue) to determine the times for the local timing signals.

This invention's period generator differs from Conner in that it also passes a digital value from counter 36 to all the local timing generators representing the time from the beginning of a sequence of period cycles (i.e., when n=0 and BOT pulse starts both period counter 18 and counter 36). The elapsed time measured by counter 36 is used by the local timing generators to compute and store times in the future at which timing signals need to be generated.

Referring again to FIG. 2 while still referring to FIG. 5. The local timing generator 9, at the start of each new period (indicated by MEOC 41), adds a phase offset time value consisting of some number of XTAL 12 clocks and residue bits (representing a fraction of a clock) to the elapsed time input from the period generator 66 and the period generators residue bits 33. This value, which represents a time in the future at which a fine timing signal should be generated, is stored in a FIFO 62. The time values at the output of the FIFO 62 are then consumed when the elapsed time 66 matches.

The time value, representing the offset from the MEOC to the timing pulse, for the timing generator for cycle n, TV(n), consists of an integer number of XTAL 12 signals (designated INT(TV(n)/XTAL)) plus a remainder value (designated REM (TV(n)/XTAL) in TIME VALUE RAMs 40,52. These offsets are shown in the FIG. 5 timing diagram enclosed in brackets.

In the Conner patent, the time value offset from the MEOC for a given period is compared directly with a local counter which measures the time from the start of a period. In this patent, the time offset TIME VALUE RAM's 40 and 52, 16 bits representing XTAL counts and bits representing the residue value respectively, determines an offset which is added to the period generators current time value, TIME 66, and a residue output to compute a time in the future at which to generate a timing event or PHASE. This time value sum is performed by adder 60. The sum, representing a time in the future (some number of XTAL clocks and a residue value) at which a timing pulse should be generated, is queued in the FIFO memory. Upon appearing at the output of the FIFO, the queued up requested upper bits of the PHASE time, is compared with the current time from the period generator. When the match detector circuit 38, detects that the desired time has been reached, a time match enable pulse is generated which is used in conjunction with the residue bits from the output of the FIFO to either generate a signal edge or sample an incoming signal 44. The output of the match detector circuit, which represents one XTAL 12 period, is also used to advance the output of the FIFO such that the next time value to generate a timing pulse is presented at the output.

Unlike the Conner patent, the time value offsets stored in TIME VALUE RAM's 40 and 52 can thus represent an offset from the start of a period which is greater than the period time. This allows the timing generator depicted in FIGS. 2, 3 and 4 to operate at a high period rate yet still adjust the timing offsets between timing generators to be up to 16 period times apart, the depth of the first-in first-out FIFO memory 62 used to store desired PHASE times. The timing diagram shown in FIG. 5 shows the difference between the timing for Conner's local edge generator, labeled PRIOR ART-EDGE GENERATOR, and the timing for two use cases of a local timing generator described by this patent. The Conner edge generator can only generate timing signals which are bounded by the period value. For example, as shown by the PRIOR ART-EDGE GENERATOR waveform, the offset for period 1 can not be larger than 4.5 XTAL clock periods. Timing generators A & B, however, demonstrate the ability to generate timing signals which not only occur in future period times, but also allow different timing generators to initiate timing signals during the same period which may or may not actually occur in the same period. This is useful for the case where one timing generator may need to compensate for delays in the system electronics which may not be required for the other timing generator. In the example shown in FIG. 5, timing generator A generates a signal with an offset of 6.25 although the period is 4.5 XTAL clocks, while timing generator B's signal is generated well within the 4.5 XTAL clock period. Note, that timing generator A also has offsets programmed for periods 1 & 2 such that the generated signals occur in the same period. This is another timing combination that is not possible with the Conner edge generator where only one timing signal can occur in a single period time.

The formula for computing the future timing signals generated by this patent's local timing generators is as follows:

$$\text{MATCH\_TIME}(n) = \text{RES}(n-1) + \text{REM}(\text{TV}(n)/\text{XTAL}) + \text{INT}(\text{TV}(n)/\text{XTAL}) + \text{TIME}(n)$$

where:

MATCH_TIME(n)=a time in the future at which a timing pulse should be generated

TV(n)=Programmed Time Value for cycle n, and

TIME(n)=Time value from the beginning of time (some number of XTAL counts)

The time match enable signal, representing one XTAL clock period, and the two residue bits, representing the phase relationship between the timing signal and the XTAL clock, from the output of the FIFO are fed to the local delay generator 44 to generate phase adjusted timing. For test signal generation the local delay generator is comprised of the circuit described in FIG. 3. For use in sampling a test signal input, an implementation is shown in FIG. 4.

Other embodiments of the invention are within the scope of the following claims. The invention can be used in any timing control system where the timing differences between the local timing generators could be greater than the period at which the timing signals are being generated. This circuitry can be used, as is also the case with the Conner patent, in applications other than automatic test systems.

While this invention has been particularly shown and described with references to preferred embodiments thereof, it will be understood by those skilled in the art that various changes in form and details may be made therein without departing from the scope of the invention encompassed by the appended claims.

What is claimed is:

1. An apparatus for providing timing signals, comprising:
a master period generator comprising:
 a first resettable counter, resettable by a selectable period signal and configured to count cycles of a received clock within a period of the selectable periodic signal;
 a memory storing a first period value and a second period value, the first and second stored period values derivable from a relationship between the received clock and the selectable periodic signal;
 a master detector circuit providing a coincidence signal indicative of an output of the first resettable counter coinciding with the stored first period value;
 a signal conditioning circuit providing the selectable period signal in response to the coincidence signal, the selectable period signal having a non-integer relationship with respect to the received clock cycles;
 a residue circuit updating, responsive to the selectable period signal, a residue value according to the stored second period value and a current residue value; and
 a second resettable counter, resettable by a beginning-of-time signal and configured to count cycles of the received clock since the beginning-of-time signal.

2. The apparatus of claim 1, further comprising a programmable delay device for delaying the period signal according to the residue value.

3. The apparatus of claim 2, wherein the programmable delay device comprises a programmable delay line.

4. The apparatus of claim 1, further comprising an apparatus of at least one local timing generator in communication with the master period generator and configured to generate a local timing signal synchronous to the received clock, having a non-integer relationship with respect to the received clock, and variable with respect to another similar local timing signal signals by more than one period of the selectable period signal.

5. The apparatus of claim 4, wherein a local timing generator comprises:
 a memory storing a first time value and a second time value;
 an adder determining a future time value by combining the number of cycles of the received clock counted since the beginning-of-time signal received from the master period generator with a total delay value;
 a buffer memory in communication with the adder and storing a buffered number of future time values, and associated future time phases;
 a local detector circuit providing a coincidence signal indicative of the number of cycles of the received clock counted since the beginning-of-time signal received from the master period generator coinciding with a selectable one of the stored future time values; and
 a delay circuit receiving a future time phase associated with the coincidence signal and providing an output timing signal at the selected one of the future time values, offset by the associated future phase.

6. A local timing generator of claim 5, further comprising an additional programmable delay device adding a programmable delay value to the output timing signal.

7. The apparatus of claim 5, wherein the delay circuit comprises:
 an edge memory storing a plurality of data words indicative of different phase relationships, the different phase relationships addressable by the associated future phase; and
 a parallel to serial converter, converting a respective one of the data words addressed by the associated future time phase into a timing edge.

8. The apparatus of claim 7 further comprising a polarity inverter for selectably inverting polarity of a timing edge.

9. The apparatus of claim 7, wherein the serial to parallel converter comprises:
 a clock multiplier producing a shorter clock cycle as a multiple of the clock cycle; and
 a parallel to serial shift register coupled to the edge memory and to the clock multiplier, the parallel to serial shift register generating the timing edge as a serial output of the addressed data word at the shorter clock cycle rate.

10. The apparatus of claim 5, wherein the delay circuit comprises:
 a clock multiplier producing a shorter clock cycle as a multiple of the received clock cycle;
 a parallel to serial converter receiving a serial input signal according to the shorter clock cycle, and converting it into a into a multi-bit digital word according to the received clock cycle; and
 a multiplexer receiving the multi-bit digital word and having an output selectable by the associated future time phase, the future time phase selecting a multiplexer channel corresponding to a preferred phase.

11. The apparatus of claim 5 wherein the delay circuit comprises a field-programmable gate array (FPGA).

12. A method for providing timing signals, comprising:
 resetting by a selectable period signal a first resettable counter counting cycles of a received clock within a period of the selectable periodic signal;
 storing a first period value and a second period value, the first and second stored period values derivable from a relationship between the received clock and the selectable periodic signal;
 generating a coincidence signal indicative of an output of the first resettable counter coinciding with the stored first period value;
 providing the selectable period signal in response to the coincidence signal, the selectable period signal having a non-integer relationship with respect to the received clock cycles;
 generating, responsive to the selectable period signal, an updated residue value according to the stored second period value and a current residue value; and
 resetting by a beginning-of-time signal a second resettable counter configured to count cycles of the received clock since the beginning-of-time signal.

13. The method of claim 12, further comprising delaying the selectable period signal by a time delay proportional to the residue value.

14. The method of claim 12, further comprising generating a local timing signal synchronous to the received clock, having a non-integer relationship with respect to the received clock, and variable with respect to another similar local timing signal signals by more than one period of the selectable period signal.

15. The method of claim 14, wherein generate a local timing signal comprises:
  storing a first time value and a second time value;
  determining a future time value by combining the number of cycles of the received clock counted since the beginning-of-time signal received from the master period generator with a total delay value;
  storing a buffered number of the determined future time values, and associated future time phases;
  generating a coincidence signal indicative of the number of cycles of the received clock counted since the beginning-of-time signal received from the master period generator coinciding with a selectable one of the stored future time values; and
  providing an output timing signal at the selected one of the future time values, offset by the associated future phase.

16. The method of claim 15, wherein providing the output timing signal comprises:
  storing a plurality of multi-bit data words indicative of different phase relationships, the different phase relationships;
  selecting a respective one of the stored plurality of multi-bit data words according to the associated future phase; and
  converting the selected one of the multi-bit data words into a serial signal indicative of the timing edge.

17. The method of claim 16, further comprising selectably inverting polarity of the timing edge.

18. The method of claim 16, wherein converting the selected one of the multi-bit data words into a serial signal indicative of the timing edge comprises:
  multiplying the received clock, to produce a shorter clock cycle; and
  parallel-to-serial shifting the selected one of the multi-bit data words at the shorter clock cycle rate.

19. The method of claim 15, wherein providing the output timing signal comprises:
  multiplying the received clock, to produce a shorter clock cycle;
  converting a serial input signal received at the shorter clock cycle to a multi-bit digital word according to the received clock cycle;
  receiving each bit of the multi-bit digital word with a respective channel of a multiplexer; and
  selecting a multiplexer channel by the associated future time phase, the selected multiplexer channel corresponding to a preferred phase.

20. A system for providing timing signals, comprising:
  means for resetting by a selectable period signal a first resettable counter counting cycles of a received clock within a period of the selectable periodic signal;
  means for storing a first period value and a second period value, the first and second stored period values derivable from a relationship between the received clock and the selectable periodic signal;
  means for generating a coincidence signal indicative of an output of the first resettable counter coinciding with the stored first period value;
  means for providing the selectable period signal in response to the coincidence signal, the selectable period signal having a non-integer relationship with respect to the received clock cycles;
  means for generating, responsive to the selectable period signal, an updated residue value according to the stored second period value and a current residue value; and
  means for resetting by a beginning-of-time signal a second resettable counter configured to count cycles of the received clock since the beginning-of-time signal.

* * * * *

UNITED STATES PATENT AND TRADEMARK OFFICE
CERTIFICATE OF CORRECTION

| | |
|---|---|
| PATENT NO. | : 7,804,349 B2 |
| APPLICATION NO. | : 12/337999 |
| DATED | : September 28, 2010 |
| INVENTOR(S) | : Christopher C. Jones et al. |

It is certified that error appears in the above-identified patent and that said Letters Patent is hereby corrected as shown below:

In column 8, line 28, in claim 10, delete "into a into a" and insert -- into a --, therefor.

Signed and Sealed this

Twenty-third Day of November, 2010

David J. Kappos
*Director of the United States Patent and Trademark Office*